(12) United States Patent
Matsumura et al.

(10) Patent No.: US 11,452,216 B2
(45) Date of Patent: Sep. 20, 2022

(54) METHOD FOR MANUFACTURING MULTILAYER PRINTED WIRING BOARD

(71) Applicant: PANASONIC INTELLECTUAL PROPERTY MANAGEMENT CO., LTD., Osaka (JP)

(72) Inventors: Kazuki Matsumura, Mie (JP);
Yohsuke Ishikawa, Fukushima (JP);
Koji Kishino, Mie (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 4 days.

(21) Appl. No.: 16/632,790

(22) PCT Filed: Jul. 25, 2018

(86) PCT No.: PCT/JP2018/027794
§ 371 (c)(1),
(2) Date: Jan. 21, 2020

(87) PCT Pub. No.: WO2019/022101
PCT Pub. Date: Jan. 31, 2019

(65) Prior Publication Data
US 2021/0161020 A1    May 27, 2021

(30) Foreign Application Priority Data
Jul. 25, 2017   (JP) .............................. JP2017-144010

(51) Int. Cl.
*H05K 3/46*    (2006.01)
*C09J 7/35*    (2018.01)
(Continued)

(52) U.S. Cl.
CPC ........... *H05K 3/4673* (2013.01); *B32B 15/02* (2013.01); *B32B 15/092* (2013.01); *B32B 15/20* (2013.01);
(Continued)

(58) Field of Classification Search
CPC .. H05K 3/46; H05K 3/4673; H05K 2203/065; B29C 43/20; B29C 70/40;
(Continued)

(56) References Cited

U.S. PATENT DOCUMENTS

2013/0161073 A1   6/2013   Lee et al.
2016/0060384 A1*  3/2016   Nakamura ............... H05K 3/22
                                                        428/209
2021/0161020 A1*  5/2021   Matsumura ............ H05K 3/022

FOREIGN PATENT DOCUMENTS

JP   61-089037    5/1986
JP   2013-135229  7/2013
(Continued)

OTHER PUBLICATIONS

Official Communication issued in International Patent Application No. PCT/JP2018/027794, dated Oct. 23, 2018, along with an English translation thereof.

*Primary Examiner* — Sonya M Sengupta
(74) *Attorney, Agent, or Firm* — Greenblum & Bernstein, P.L.C.

(57) ABSTRACT

A first stack is formed by stacking a first sheet of metal foil, a first prepreg, and a second sheet of metal foil, one on top of another. The first prepreg is thermally cured by thermally pressing these members to make a double-sided metal-clad laminate. Conductor wiring is formed by partially removing the first sheet of metal foil from the double-sided metal-clad laminate to make a printed wiring board. After a third sheet of metal foil has been preheated, the conductor wiring of the printed wiring board, a second prepreg, and the third sheet
(Continued)

of metal foil are stacked one on top of another and thermally pressed together. The first insulating layer has a lower linear expansion coefficient than any of the first sheet of metal foil or the second sheet of metal foil does.

10 Claims, 1 Drawing Sheet

(51) Int. Cl.
*C09J 7/10* (2018.01)
*B32B 15/02* (2006.01)
*B32B 15/092* (2006.01)
*B32B 15/20* (2006.01)
*B32B 27/20* (2006.01)
*B32B 27/38* (2006.01)
*B32B 37/06* (2006.01)
*B32B 37/10* (2006.01)
*C09J 5/06* (2006.01)
*C09J 11/02* (2006.01)
*B29C 70/42* (2006.01)
*B29K 63/00* (2006.01)
*B29L 31/34* (2006.01)

(52) U.S. Cl.
CPC .............. *B32B 27/20* (2013.01); *B32B 27/38* (2013.01); *B32B 37/06* (2013.01); *B32B 37/10* (2013.01); *C09J 5/06* (2013.01); *C09J 7/10* (2018.01); *C09J 7/35* (2018.01); *C09J 11/02* (2013.01); *B29C 70/42* (2013.01); *B29K 2063/00* (2013.01); *B29L 2031/3425* (2013.01); *B32B 2307/206* (2013.01); *B32B 2311/12* (2013.01); *B32B 2363/00* (2013.01); *B32B 2457/08* (2013.01); *C09J 2203/326* (2013.01); *C09J 2400/26* (2013.01); *C09J 2463/00* (2013.01); *H05K 2203/065* (2013.01)

(58) Field of Classification Search
CPC ...... B29C 70/42; C09J 7/35; C09J 7/10; C09J 5/06; C09J 11/02; C09J 2203/326; C09J 2400/26; C09J 2463/00; B32B 15/02; B32B 15/092; B32B 15/20; B32B 27/20; B32B 27/38; B32B 37/06; B32B 37/10; B32B 2264/1027; B32B 2264/1021; B32B 2307/206; B32B 2311/12; B32B 2363/00; B32B 2457/08; B29K 2063/00; B29K 2105/089; B29L 2031/3425
See application file for complete search history.

(56) References Cited

FOREIGN PATENT DOCUMENTS

| JP | 2014-111361 | 6/2014 |
| JP | 2016-068277 | 5/2016 |

* cited by examiner

METHOD FOR MANUFACTURING MULTILAYER PRINTED WIRING BOARD

CROSS-REFERENCE TO RELATED APPLICATIONS

This application is a National Stage of International Application No. PCT/JP2018/027794 filed Jul. 25, 2018, claiming priority based on Japanese Patent Application No. 2017-144010 filed Jul. 25, 2017, the contents of each application being incorporated herein by reference in its entirety.

TECHNICAL FIELD

The present invention generally relates to a method for manufacturing a multilayer printed wiring board, and more particularly relates to a method for manufacturing a multilayer printed wiring board by adding an insulating layer and a conductor layer onto the conductor wiring of a printed wiring board.

BACKGROUND ART

Recently, as electronic devices have been developed to have further improved functionalities and even higher densities, those electronic devices need to be made in even smaller sizes, integrated together even more densely, and required to operate at even higher speeds using an even larger number of pins. Accordingly, printed wiring boards also need to have even higher densities, even smaller diameters, even lighter weights, and further reduced thicknesses.

To meet such demands, attempts have been made to reduce the respective thicknesses of an insulating layer and a conductor layer that form parts of a printed wiring board. In general, a multilayer printed wiring board with four conductor layers (i.e., a so-called "four-layer board") and a multilayer printed wiring board with six conductor layers (i.e., a so-called "six-layer board") are used extensively. As an attempt to reduce the thicknesses of printed wiring boards, a multilayer printed wiring board with an odd number of conductor layers such as a three-layer board or a five-layer board has been provided by removing one conductor layer from any of these multilayer printed wiring boards.

Generally speaking, a multilayer printed wiring board is often manufactured by a process using a prepreg and a sheet of metal foil as materials and including a thermal pressing process step. In that case, the resultant multilayer printed wiring board sometimes warps due to a difference in linear expansion coefficient between an insulating layer, which is a cured product of the prepreg, and the sheet of metal foil. Such warp is remarkable particularly when a multilayer printed wiring board with an odd number of conductor layers is manufactured.

Patent Literature 1 discloses a technique for reducing the warp of a multilayer printed wiring board with an odd number of conductor layers during a manufacturing process thereof. According to the method of Patent Literature 1, a stack, obtained by interposing a prepreg between two sheets of metal foil, is preheated and then heated and pressed to make a double-sided metal-clad laminate. Then, only one of the two sheets of metal foil of the double-sided metal-clad laminate is subjected to a wiring forming process for forming conductor wiring, thus obtaining a printed wiring board. Next, a prepreg and a sheet of metal foil are stacked one on top of the other on the conductor wiring of the printed wiring board to make a multilayer stack. Thereafter, the multilayer stack is preheated and then heated and pressed to make a multilayer printed wiring board. The sheet of metal foil, forming the outermost layer of the multilayer printed wiring board, is subjected to a wiring forming process as needed to form conductor wiring.

According to the method described in Patent Literature 1, even when the printed wiring board is warped such that one surface thereof with the conductor wiring is depressed, the warp is still reducible when a multilayer printed wiring board is formed out of the printed wiring board.

CITATION LIST

Patent Literature

Patent Literature 1: JP 2016-68277 A

SUMMARY OF INVENTION

It is therefore an object of the present invention to provide a method for manufacturing a multilayer printed wiring board such that even when a printed wiring board is warped to have one surface thereof with conductor wiring protruding while the multilayer printed wiring board is being manufactured by adding an insulating layer and a conductor layer onto the conductor wiring of the printed wiring board, the warp is still reducible.

A method for manufacturing a multilayer printed wiring board according to an aspect of the present invention includes:

forming a first stack by stacking a first sheet of metal foil, a first prepreg, and a second sheet of metal foil, one on top of another such that the first prepreg is interposed between the first sheet of metal foil and the second sheet of metal foil;

forming a first insulating layer from the first prepreg by thermally pressing the first stack and thereby thermally curing the first prepreg to make a double-sided metal-clad laminate in which the second sheet of metal foil, the first insulating layer, and the first sheet of metal foil are stacked one on top of another in this order;

forming conductor wiring by partially removing the first sheet of metal foil from the double-sided metal-clad laminate to make a printed wiring board in which the second sheet of metal foil, the first insulating layer, and the conductor wiring are stacked one on top of another in this order;

forming a second stack by stacking the conductor wiring of the printed wiring board, a second prepreg, and a third sheet of metal foil, one on top of another such that the second prepreg is interposed between the conductor wiring of the printed wiring board and the third sheet of metal foil; and forming a second insulating layer from the second prepreg by thermally pressing the second stack and thereby thermally curing the second prepreg.

The third sheet of metal foil is stacked on the second prepreg after having been preheated. The first insulating layer has a lower linear expansion coefficient than any of the first sheet of metal foil or the second sheet of metal foil does.

DESCRIPTION OF EMBODIMENTS

Figure 1A:
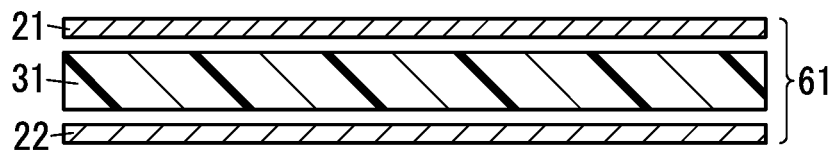
FIG. 1A is a schematic cross-sectional view illustrating a process step of an exemplary method for manufacturing a multilayer printed wiring board according to an embodiment of the present invention.

An exemplary embodiment to be described below generally relates to a method for manufacturing a multilayer printed wiring board, and more particularly relates to a method for manufacturing a multilayer printed wiring board by adding an insulating layer and a conductor layer onto the conductor wiring of a printed wiring board.

First of all, it will be described how the present inventors acquired the basic idea of the configuration of the present invention.

According to the method for manufacturing a multilayer printed wiring board as disclosed in JP 2016-68277 A (Patent Literature 1), even when a printed wiring board is warped such that one surface thereof with the conductor wiring is depressed, the warp is still reducible when a multilayer printed wiring board is formed out of the printed wiring board.

Depending on the relationship between the linear expansion coefficient of an insulating layer and that of a sheet of metal foil, however, the printed wiring board may warp such that the surface thereof with the conductor wiring protrudes. The method of Patent Literature 1 is unable to reduce such a warp effectively.

Also, when a multilayer printed wiring board is manufactured by adding an insulating layer and a conductor layer onto a printed wiring board, a semiconductor chip and other electronic parts are often surface-mounted onto the conductor layer added. In a situation where the printed wiring board is warped, when an electronic part is mounted onto the printed wiring board, the gap between the printed wiring board and the electronic part locally widens at some spot, thus increasing the chances of causing a connection failure there. The area of that spot varies with the direction of the warp of the printed wiring board. If the multilayer printed wiring board is warped such that one surface thereof with the conductor layer added to the multilayer printed wiring board is depressed, the gap between the multilayer printed wiring board and the electronic part widens only in the central region, and therefore, the area of that spot with the widened gap is relatively small. On the other hand, if the multilayer printed wiring board is warped such that the surface with the conductor layer added to the multilayer printed wiring board protrudes, the gap between the multilayer printed wiring board and the electronic part widens at both ends, and therefore, the total area of the spots with the widened gap is relatively large. That is why such a warp of the multilayer printed wiring board that causes the surface with the conductor layer added to protrude increases the chances of causing a connection failure between the multilayer printed wiring board and the electronic part.

The present inventors carried out extensive researches to conceive a basic idea of our invention that allows, even when a printed wiring board is warped such that one surface thereof with the conductor wiring protrudes, such a warp to be reduced.

Next, a method for manufacturing a multilayer printed wiring board 10 according to an exemplary embodiment of the present invention will now be described with reference to FIGS. 1A-1E.

In this embodiment, a multilayer printed wiring board 10 with three conductor layers is manufactured. As used herein, a "conductor layer" refers to a layer made of a conductor in the printed wiring board 1 and includes a sheet of metal foil and conductor wiring.

In the method for manufacturing a multilayer printed wiring board 10 according to this embodiment, a first stack 61 is formed by stacking a first sheet of metal foil 21, a first prepreg 31, and a second sheet of metal foil 22, one on top of another such that the first prepreg 31 is interposed between the first sheet of metal foil 21 and the second sheet of metal foil 22. In the first stack 61, the second sheet of metal foil 22, the first prepreg 31, and the first sheet of metal foil 21 are arranged in this order in one direction (hereinafter referred to as a "first direction").

Figure 1B:
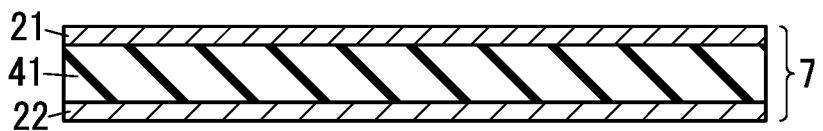
FIG. 1B is a schematic cross-sectional view illustrating another process step of the exemplary method for manufacturing a multilayer printed wiring board according to the embodiment of the present invention.

Next, a first insulating layer 41 is formed from the first prepreg 31 by thermally pressing the first stack 61 and thereby thermally curing the first prepreg 31. In this manner, a double-sided metal-clad laminate 7 in which the second sheet of metal foil 22, the first insulating layer 41, and the first sheet of metal foil 21 are stacked one on top of another in this order is made as shown in FIG. 1B. The second sheet of metal foil 22, the first insulating layer 41, and the first sheet of metal foil 21 are arranged in this order in the first direction.

The first insulating layer 41 has a lower linear expansion coefficient than any of the first sheet of metal foil 21 or the second sheet of metal foil 22 does.

Figure 1C:
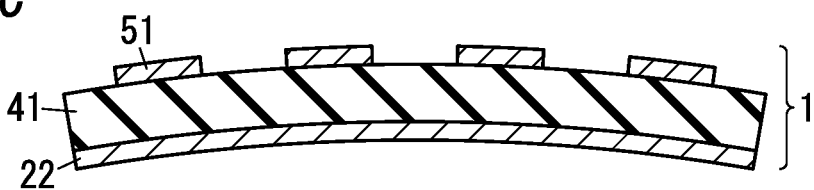
FIG. 1C is a schematic cross-sectional view illustrating still another process step of the exemplary method for manufacturing a multilayer printed wiring board according to the embodiment of the present invention.

Next, conductor wiring 51 is formed by partially removing the first sheet of metal foil 21 from the double-sided metal-clad laminate 7 to make a printed wiring board 1 in which the second sheet of metal foil 22, the first insulating layer 41, and the conductor wiring 51 are stacked one on top of another in this order as shown in FIG. 1C. The second sheet of metal foil 22, the first insulating layer 41, and the conductor wiring 51 are arranged in this order in the first direction.

Figure 1D:
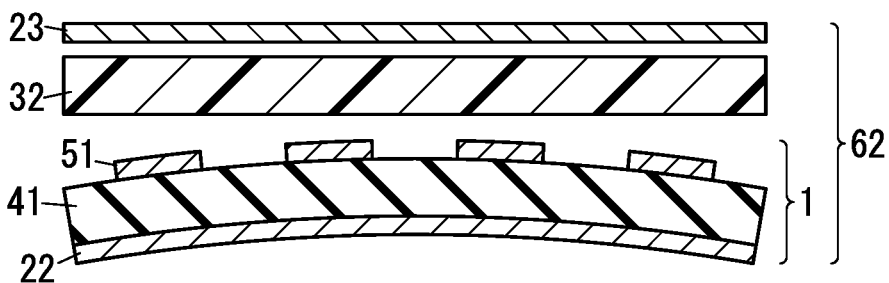
FIG. 1D is a schematic cross-sectional view illustrating yet another process step of the exemplary method for manufacturing a multilayer printed wiring board according to the embodiment of the present invention.

Subsequently, a second stack 62 is formed by stacking the conductor wiring 51 of the printed wiring board 1, a second prepreg 32, and a third sheet of metal foil 23, one on top of another such that the second prepreg 32 is interposed between the conductor wiring 51 of the printed wiring board 1 and the third sheet of metal foil 23 as shown in FIG. 1D. The third sheet of metal foil 23 is stacked on the second prepreg 32 after having been preheated. In the second stack 62, the second sheet of metal foil 22, the first insulating layer 41, the conductor wiring 51, the second prepreg 32, and the third sheet of metal foil 23 are arranged in this order in the first direction.

Figure 1E:
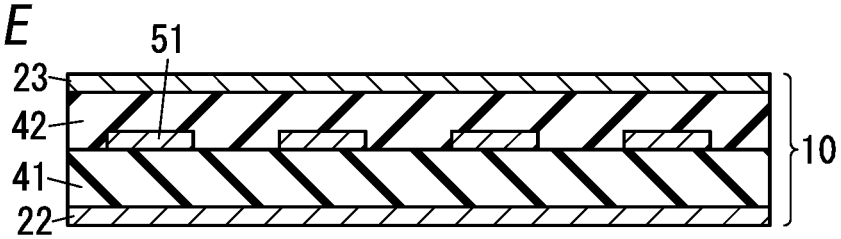
FIG. 1E is a schematic cross-sectional view illustrating yet another process step of the exemplary method for manufacturing a multilayer printed wiring board according to the embodiment of the present invention.

Thereafter, a second insulating layer 42 is formed from the second prepreg 32 by thermally pressing the second stack 62 and thereby thermally curing the second prepreg 32. In this manner, a multilayer printed wiring board 10 is manufactured as shown in FIG. 1E.

This embodiment allows, even when the printed wiring board 1 is warped such that one surface thereof with the conductor wiring 51 protrudes (i.e., protrudes in the first direction) as shown in FIG. 1C, the warp to be reduced. The warp would be reduced presumably in the following mechanism. Note that the following description of the mechanism should not be construed as limiting this exemplary embodiment.

In this embodiment, the first insulating layer 41 has a lower linear expansion coefficient than any of the first sheet of metal foil 21 or the second sheet of metal foil 22 does. Thus, when the double-sided metal-clad laminate 7 is formed by thermal pressing, the first sheet of metal foil 21 and the second sheet of metal foil 22 are likely to expand more significantly than the first insulating layer 41. Next, when cooled after having been thermally pressed, the first sheet of metal foil 21 and the second sheet of metal foil 22 that have expanded significantly try to shrink more significantly than the first insulating layer 41. In that case, the first insulating layer 41 is constrained by the first sheet of metal foil 21 and the second sheet of metal foil 22, and therefore, shrinks, along with the first sheet of metal foil 21 and the second sheet of metal foil 22, to a greater degree than originally expected. That is why stress that causes the first insulating layer 41 to try to expand perpendicularly to the first direction is produced in the first insulating layer 41 of the double-sided metal-clad laminate 7 that has been cooled. That is to say, stress that causes the first insulating layer 41 to try to expand along its principal surface is produced in the first insulating layer 41. However, since the first insulating layer 41 is constrained by the first sheet of metal foil 21 and the second sheet of metal foil 22, the double-sided metal-clad laminate 7 is hardly warped at this point in time.

When the conductor wiring 51 is formed by partially removing the first sheet of metal foil 21 from the double-sided metal-clad laminate 7, the conductor wiring 51 constrains the first insulating layer 41 less tightly than the first sheet of metal foil 21. Thus, the stress in the first insulating layer 41 is partially released. That is to say, the stress in a part, covered with the conductor wiring 51, of the first insulating layer 41 is partially released to cause that part with the conductor wiring 51 of the first insulating layer 41 to try to expand. Nevertheless, another part, in contact with the second sheet of metal foil 22, of the first insulating layer 41 is still constrained by the second sheet of metal foil 22. Thus, the stress causing that part in contact with the second sheet of metal foil 22 of the first insulating layer 41 to try to expand is not easily released. Consequently, the part with the conductor wiring 51 of the first insulating layer 41 tries to expand more significantly than that part in contact with the second sheet of metal foil 22 of the first insulating layer 41, thus causing the first insulating layer 41 to warp to protrude in the first direction. As a result, the entire printed wiring board 1 also warps to protrude in the first direction.

Suppose the second stack 62 is formed by stacking the second prepreg 32 and the third sheet of metal foil 23 on the printed wiring board 1 without preheating the third sheet of metal foil 23 and then thermally pressed to manufacture the multilayer printed wiring board 10. In that case, when the multilayer printed wiring board 10 is cooled, stress that causes the second insulating layer 42 formed from the second prepreg 32 to try to expand is produced in the second insulating layer 42, thus leaving the printed wiring board 1 still warped. That is to say, the multilayer printed wiring board 10 will warp to protrude in the first direction.

In contrast, according to this embodiment, it is not until the third sheet of metal foil 23 is preheated that the third sheet of metal foil 23 is stacked on the second prepreg 32. That is to say, the second stack 62 is formed after the third sheet of metal foil 23 has been preheated. Thus, when the second stack 62 is formed, the third sheet of metal foil 23 has already expanded. Even if this second stack 62 is thermally pressed, the third sheet of metal foil 23 is unlikely to further expand, thus preventing the second prepreg 32, or the second insulating layer 42, from expanding under the heat. When the multilayer printed wiring board 10 obtained by thermal pressing is cooled, the third sheet of metal foil 23 and the second insulating layer 42 try to shrink. At this time, since the third sheet of metal foil 23 shrinks more significantly than the second insulating layer 42, stress that causes the second insulating layer 42 to try to expand is produced in the second insulating layer 42. Nevertheless, when the second insulating layer 42 is formed by thermal pressing, the second insulating layer 42 is prevented from expanding. Thus, the stress produced in the second insulating layer 42 after having been cooled becomes less than the stress produced in the first insulating layer 41. Since the third sheet of metal foil 23 shrinks and the stress produced in the second insulating layer 42 is less than the stress produced in the first insulating layer 41, the multilayer printed wiring board 10 tends to warp in the opposite direction from the first direction. Thus, the warp tendency during the manufacturing of the printed wiring board 1 is canceled by the warp tendency during the manufacturing of the multilayer printed wiring board 10, thus either making the multilayer printed wiring board 10 flatter or causing the multilayer printed wiring board 10 to warp in the opposite direction from the first direction.

Thus, this embodiment reduces the warp of the multilayer printed wiring board 10 that causes the multilayer printed wiring board 10 to protrude in the first direction. As used herein, when the "warp is reduced," it means that the multilayer printed wiring board 10 becomes flatter than the printed wiring board 1 or warp to protrude in the opposite direction from the first direction.

Furthermore, this warp is reducible without causing an increase in the thickness of the multilayer printed wiring board 10. As used herein, the phrase "without causing an increase in the thickness" means that the means for reducing the warp of the multilayer printed wiring board 10 according to this embodiment does not involve an increase in the thickness of the multilayer printed wiring board 10. That is to say, this phrase does not mean that the thickness of the multilayer printed wiring board 10 according to this embodiment is smaller than the thickness of a known multilayer printed wiring board 10.

Also, in this description, the "linear expansion coefficient" refers to a linear expansion coefficient in the direction perpendicular to the first direction. The respective linear expansion coefficients of the first sheet of metal foil 21, the second sheet of metal foil 22, the third sheet of metal foil 23, the first insulating layer 41, and the second insulating layer 42 are measured by thermal mechanical analysis (TMA) under the condition including a measuring temperature range from 30° C. to 350° C., a temperature increase rate of 10° ° C./min, and a tensile load of 200 mN.

A manufacturing method according to this embodiment will be described in further detail.

In this embodiment, metal foil and a prepreg are provided as materials for the multilayer printed wiring board 10. The metal foil includes a first sheet of metal foil 21, a second sheet of metal foil 22, and a third sheet of metal foil 23. The prepreg includes a first prepreg 31 and a second prepreg 32.

The respective linear expansion coefficients of the first sheet of metal foil 21, the second sheet of metal foil 22, and the third sheet of metal foil 23 suitably fall within the range from 14 ppm/K to 18 ppm/K.

The first sheet of metal foil 21, the second sheet of metal foil 22, and the third sheet of metal foil 23 each suitably have a thickness falling within the range from 0.002 mm to 0.035 mm, for example. In particular, setting the thickness of the third sheet of metal foil 23 at a value falling within the range from 0.002 mm to 0.035 mm allows the warp of the multilayer printed wiring board 10 to be further reduced without causing an increase in the thickness of the multilayer printed wiring board 10.

Each of the first sheet of metal foil 21, the second sheet of metal foil 22, and the third sheet of metal foil 23 is suitably a sheet of copper foil such as electrolytic copper foil or rolled copper foil. However, the first sheet of metal foil 21, the second sheet of metal foil 22, and the third sheet of metal foil 23 do not have to be sheets of copper foil but may also be sheets of aluminum foil or sheets of stainless steel foil.

The first prepreg 31 suitably includes a thermosetting resin composition (hereinafter referred to as "Composition (X)") and a fibrous base material. In this embodiment, the first prepreg 31 and the second prepreg 32 each include a fibrous base material and a dried product or semi-cured product of the Composition (X) impregnated into the fibrous base material. Each of the first prepreg 31 and the second prepreg 32 may be formed by, for example, impregnating the Composition (X) into the fibrous base material and then heating and thereby drying or semi-curing the Composition (X).

Examples of fibers for use in the fibrous base material include inorganic fibers such as glass fibers, and organic fibers such as aramid fibers, polyparaphenylene benzobisoxazole (PBO) fibers, polybenzoimidazole (PBI) fibers, polytetrafluoroethylene (PTFE) fibers, polyparaphenylene benzobisthiazole (PBZT) fibers, and fully aromatic polyester fibers. The fibrous base material may be a woven fabric or a nonwoven fabric, whichever is appropriate.

The Composition (X) contains a thermosetting resin. The thermosetting resin contains at least one component selected from the group consisting of epoxy resins, phenolic resins, cyanate resins, melamine resins, imide resins, and bismaleimide triazine resins.

The thermosetting resin suitably contains an epoxy resin. The epoxy resin contains at least one component selected from the group consisting of polyfunctional epoxy resins, bisphenol epoxy resins, novolac epoxy resins, and biphenyl epoxy resins.

Optionally, the Composition (X) may contain a curing agent that reacts to the thermosetting resin. When the thermosetting resin contains an epoxy resin, the curing agent may contain at least one component selected from the group consisting of a diamine based curing agent such as primary amine or secondary amine, a phenol based curing agent, an acid anhydride based curing agent, dicyandiamide, and polyphenylene ether (PPE).

The content of the curing agent is appropriately adjusted according to the types of the thermosetting resin and the curing agent such that the Composition (X) has good curing properties. When the Composition (X) contains an epoxy resin and a curing agent with a hydroxyl group, the equivalent ratio of the epoxy resin to the curing agent suitably falls within the range from 0.8:1.2 to 1.2:0.8.

Optionally, the Composition (X) may contain a curing promoter. The curing promoter may contain at least one component selected from the group consisting of imidazoles and derivatives thereof, organophosphorus compounds, metal soaps such as zinc octanoate, secondary amines, tertiary amines, and quaternary ammonium salts.

The Composition (X) suitably contains an inorganic filler. The inorganic filler may contain at least one component selected from the group consisting of spherical silica, barium sulfate, silicon oxide powder, crushed silica, calcined talc, barium titanate, titanium oxide, clay, alumina, mica, boehmite, zinc borate and zinc stannate, and various metal oxides and metal hydrates other than these. The ratio of the inorganic filler to the total solid content of the Composition (X) may fall, for example, within the range from 20% by mass to 80% by mass.

The subtotal of the inorganic filler, contained in the Composition (X), and the fibrous base material suitably accounts for 50% by mass to 85% by mass of the grand total of the Composition (X) and the fibrous base material. This reduces the chances of the linear expansion coefficient of an insulating layer to be formed by thermally curing a prepreg including this Composition (X) becoming too high and also reduces the chances of the peel strength of the insulating layer with respect to the sheets of metal foil becoming too low. The subtotal of the inorganic filler, contained in the Composition (X), and the fibrous base material more suitably accounts for 55% by mass to 80% by mass of the grand total of the Composition (X) and the fibrous base material.

The Composition (X) may further contain an appropriate additive such as a light stabilizer, a viscosity modifier, and a flame retardant.

The Composition (X) may contain a solvent. The solvent includes at least one component selected from the group consisting of acetone, ketone solvents such as methyl ethyl ketone and cyclohexanone, aromatic solvents such as toluene and xylene, and nitrogen-containing solvents such as dimethyl formamide.

The second insulating layer 42 formed by thermally curing the second prepreg 32 suitably has a lower linear expansion coefficient than the third sheet of metal foil 23 does. This further reduces the chances of the multilayer printed wiring board 10 warping to protrude in the first direction. This also reduces the chances of the multilayer printed wiring board 10 warping too much in the opposite direction from the first direction.

The first insulating layer 41 suitably has a linear expansion coefficient falling within the range from 5 ppm/K to 17 ppm/K. This allows the warp of the multilayer printed wiring board 10 to be reduced particularly significantly. This also reduces the chances of the peel strength of the first sheet of metal foil 21 and the second sheet of metal foil 22 decreasing excessively.

The difference in linear expansion coefficient between the first insulating layer 41 and the first and second sheets of metal foil 21, 22 is suitably equal to or less than 12 ppm/K, and more suitably equal to or less than 11 ppm/K. This allows the warp of the multilayer printed wiring board 10 to be further reduced.

The second insulating layer 42 suitably has a linear expansion coefficient falling within the range from 5 ppm/K to 17 ppm/K. This allows the warp of the multilayer printed wiring board 10 to be reduced particularly significantly. This also reduces the chances of the peel strength of the third sheet of metal foil 23 decreasing excessively.

The difference in linear expansion coefficient between the second insulating layer 42 and the third sheet of metal foil 23 is suitably equal to or less than 12 ppm/K, and more suitably equal to or less than 11 ppm/K. This allows the warp of the multilayer printed wiring board 10 to be further reduced.

The first insulating layer 41 and the second insulating layer 42 each suitably have a thickness of 50 μm or less. Setting the thickness of each of the first insulating layer 41 and the second insulating layer 42 at 50 μm or less allows the warp of the multilayer printed wiring board 10 to be further reduced without causing an increase in the thickness of the multilayer printed wiring board 10.

The first insulating layer 41 and the second insulating layer 42 may have either mutually different thicknesses or the same thickness. It is recommended that the first insulating layer 41 and the second insulating layer 42 have the same thickness. Making the first insulating layer 41 as thick as the second insulating layer 42 allows the warp of the multilayer printed wiring board 10 to be reduced particularly significantly.

Such a low linear expansion coefficient is achievable either by increasing the content of the inorganic filler in the Composition (X) or using a piece of glass cloth with a low linear expansion coefficient as the fibrous base material.

The multilayer printed wiring board 10 suitably has a degree of warp greater than −35 mm and equal to or less than 2 mm. Setting the degree of warp of the multilayer printed wiring board 10 at a value falling within this range allows the warp of the multilayer printed wiring board 10 to be further reduced, thus providing a multilayer printed wiring board 10 that hardly causes a contact failure with an electronic part, for example. The degree of warp of the multilayer printed wiring board 10 is more suitably greater than −25 mm and equal to or less than 0 mm. This allows the warp of the multilayer printed wiring board 10 to be reduced particularly significantly. Note that the degree of warp of the multilayer printed wiring board 10 is measured by the same method as the one to be described later about specific examples. A degree of warp with a positive value means that a warp has been produced to cause the multilayer printed wiring board 10 to protrude in the first direction. A degree of warp with a negative value means that a warp has been produced to cause the multilayer printed wiring board 10 to protrude in the opposite direction from the first direction.

Next, a method for manufacturing a multilayer printed wiring board 10 using these materials will be described.

First of all, a printed wiring board 1 is made. For this purpose, a first stack 61 is formed by stacking a first sheet of metal foil 21, a first prepreg 31, and a second sheet of metal foil 22 one on top of another such that the first prepreg 31 is interposed between the first sheet of metal foil 21 and the second sheet of metal foil 22 as shown in FIG. 1A. The first prepreg 31 may include either a single prepreg or a plurality of prepregs, whichever is appropriate. That is to say, in the first stack 61, the second sheet of metal foil 22, the single or multiple first prepregs 31, and the first sheet of metal foil 21 are arranged in this order in the first direction.

When the first stack 61 is formed, the first sheet of metal foil 21, the second sheet of metal foil 22, and the first prepreg 31 suitably have an ordinary temperature, namely, a temperature falling within the range from 5° C. to 35° C.

Subsequently, the first stack 61 is thermally pressed. This allows the first insulating layer 41 to be formed from the first prepreg 31 by thermally curing the first prepreg 31. In this manner, a double-sided metal-clad laminate 7, in which the second sheet of metal foil 22, the first insulating layer 41, and the first sheet of metal foil 21 are stacked one on top of another in this order is made as shown in FIG. 1B.

Examples of thermal pressing methods include multi-stage vacuum pressing, double-belt pressing, pressing using a linear load roller, and pressing using a vacuum laminator. The highest heating temperature during the thermal pressing varies according to the composition of the resin composition but may fall within the range from 160° C. to 340° C. Also, the pressure applied during the thermal pressing may fall within the range from 0.5 MPa to 5 MPa, and the heating duration may fall within the range from 1 minute to 240 minutes, for example.

After having been thermally pressed, the double-sided metal-clad laminate 7 is cooled. Specifically, the double-sided metal-clad laminate 7 is suitably cooled to an ordinary temperature, namely, a temperature falling within the range from 5° C. to 35° C. At this time, stress that causes the first insulating layer 41 to try to expand perpendicularly to the first direction is produced in the first insulating layer 41 as described above.

Next, only the first sheet of metal foil 21, out of the two sheets of metal foil of the double-sided metal-clad laminate 7, is subjected to wiring forming processing, thus forming conductor wiring 51. That is to say, the conductor wiring 51 is formed by partially removing the first sheet of metal foil 21. For this purpose, a photolithographic process may be adopted, for example. In this manner, a printed wiring board 1 in which the second sheet of metal foil 22, the first insulating layer 41, and the conductor wiring 51 are stacked one on top of another in this order in the first direction is made as shown in FIG. 1C. In this printed wiring board 1, the stress in the first insulating layer 41 is partially released as described above, thus causing the printed wiring board 1 to warp and protrude in the first direction.

Subsequently, a multilayer printed wiring board 10 is formed out of the printed wiring board 1. For this purpose, after the third sheet of metal foil 23 has been preheated, a second stack 62 is formed by stacking the conductor wiring 51 of the printed wiring board 1, the second prepreg 32, and the third sheet of metal foil 23 one on top of another such that the second prepreg 32 is interposed between the conductor wiring 51 and the third sheet of metal foil 23 as shown in FIG. 1D. The second prepreg 32 may include either a single prepreg or a plurality of prepregs, whichever is appropriate. That is to say, in the second stack 62, the second sheet of metal foil 22, the first insulating layer 41, the conductor wiring 51, the single or multiple second prepregs 32, and the third sheet of metal foil 23 are arranged in this order in the first direction.

The third sheet of metal foil 23 may be, but does not have to be, preheated in an oven, for example. In any case, the third sheet of metal foil 23 is suitably preheated to a temperature falling within the range from 60° C. to 250° C. That is to say, the second stack 62 is suitably formed while the third sheet of metal foil 23 has a temperature falling within the range from 60° C. to 250° C. Setting the temperature of the third sheet of metal foil 23 at a temperature equal to or higher than 60° C. allows the warp tendency produced while the printed wiring board 1 is being made to be sufficiently canceled by the warp tendency produced while the multilayer printed wiring board 10 is being made, thus reducing the warp of the multilayer printed wiring board 10 effectively. In addition, setting the temperature of the third sheet of metal foil 23 at a temperature equal to or lower than 250° C. reduces the chances of the multilayer printed wiring board 10 warping too much while the multilayer printed wiring board 10 is being made. The third sheet of metal foil 23 is more suitably preheated to a temperature falling within the range from 70° C. to 230° C. This allows the warp of the multilayer printed wiring board 10 to be reduced particularly significantly.

While the second stack 62 is being formed, the printed wiring board 1 and the second prepreg 32 suitably have an ordinary temperature.

Next, the second stack 62 is thermally pressed. When formed, the second stack 62 is suitably thermally pressed immediately. This allows the second insulating layer 42 to be formed from the second prepreg 32 by thermally curing the second prepreg 32. In this manner, a multilayer printed wiring board 10 is made. In the multilayer printed wiring board 10, the second sheet of metal foil 22, the first insulating layer 41, the conductor wiring 51, the second insulating layer 42, and the third sheet of metal foil 23 are arranged in this order in the first direction as shown in FIG. 1E.

Examples of thermal pressing methods include multi-stage vacuum pressing, double-belt pressing, pressing using a linear load roller, and pressing using a vacuum laminator. The highest heating temperature during the thermal pressing varies according to the chemical makeup of the resin composition but may fall within the range from 160° C. to 340° C. Also, the pressure applied during the thermal pressing may fall within the range from 0.5 MPa to 5 MPa, and the heating duration may fall within the range from 1 minute to 240 minutes, for example.

After having been thermally pressed, the multilayer printed wiring board 10 is cooled. The multilayer printed wiring board 10 is suitably cooled to an ordinary temperature.

In this manner, a multilayer printed wiring board 10 with three conductor layers is manufactured. The three conductor layers include the one conductor wiring 51 and the two sheets of metal foil (namely, the second sheet of metal foil 22 and the third sheet of metal foil 23). This multilayer printed wiring board 10 has had its warp reduced as described above.

Optionally, conductor wiring may be formed by subjecting either the second sheet of metal foil 22 or third sheet of metal foil 23 of the multilayer printed wiring board 10, or both, to wiring forming processing. That is to say, the conductor wiring may be formed by partially removing either the second sheet of metal foil 22 or the third sheet of metal foil 23. In that case, a multilayer printed wiring board 10 with three conductor layers consisting of two conductor wirings and a single sheet of metal foil or a multilayer printed wiring board 10 with three conductor layers consisting of three conductor wirings may be manufactured.

Optionally, a multilayer printed wiring board with five or a larger odd number of conductor layers, such as a multilayer printed wiring board with five conductor layers or a multilayer printed wiring board with seven conductor layers, may also be manufactured by further increasing the number of layers of this multilayer printed wiring board 10 with three conductor layers by a known method. Alternatively, a multilayer printed wiring board with an even number of conductor layers may also be manufactured by further increasing the number of layers of this multilayer printed wiring board 10. Since the multilayer printed wiring board 10 with three conductor layers has had its warp reduced, a multilayer printed wiring board with an even larger number of layers may also have its warp reduced.

Examples

Next, specific examples of the present invention will be presented. Note that the specific examples to be described below are only examples of the present invention and should not be construed as limiting.

1. Manufacturing Multilayer Printed Wiring Board

A sheet of copper foil was provided as each of the first, second, and third sheets of metal foil, and first and second prepregs were also provided.

The respective thicknesses and linear expansion coefficients of the first, second, and third sheets of metal foil are as shown in the following tables.

The first prepreg was formed in the following manner. Specifically, first, the respective components shown in the "1st prepreg composition" column of the tables were mixed together to prepare a thermosetting resin composition. The thermosetting resin composition was impregnated into a fibrous base material "1017 Cloth" (which is the name of a product manufactured by Asahi Kasei Corporation and which had a thickness of 15 μm), and then heated at 140° C. for two minutes to form the first prepreg. The percentage (resin content) of the dried or semi-cured product of the thermosetting resin composition to the entire first prepreg was 70% by mass.

The second prepreg was formed in the following manner. Specifically, first, the respective components shown in the "2nd prepreg composition" column of the tables were mixed together to prepare a thermosetting resin composition. The thermosetting resin composition was impregnated into a fibrous base material "1017 Cloth" (which is the name of a product manufactured by Asahi Kasei Corporation and which had a thickness of 15 μm), and then heated at 140° C. for two minutes to form the second prepreg. The percentage (resin content) of the dried or semi-cured product of the thermosetting resin composition to the entire second prepreg was 70% by mass.

Following are the details of the components shown in the tables:

Polyfunctional epoxy resin: EPPN-502H manufactured by Nippon Kayaku Co., Ltd.;

Phenol based curing agent: TD-209060M manufactured by DIC Corporation;

Silica: SC-2050 MTX manufactured by Admatechs;

Talc: D-800 manufactured by Nippon Talc Co., Ltd.; and

Aluminum hydroxide: CL-303 manufactured by Sumitomo Chemical Co., Ltd.

A first stack was formed by stacking these materials one on top of another such that a single first prepreg was interposed between a first sheet of metal foil and a second sheet of metal foil. A first insulating layer was formed from the first prepreg by thermally pressing the first stack under the condition described in the "thermal pressing condition (1st cycle)" of the tables and thereby thermally curing the first prepreg. Then, the first stack was cooled to 25° C. In this manner, a double-sided metal-clad laminate was made.

The thickness and linear expansion coefficient of the first insulating layer in this double-sided metal-clad laminate are as shown in the tables.

The first sheet of metal foil of this double-sided metal-clad laminate was partially removed through an etching process, thereby forming conductor wiring. In this manner, a printed wiring board was made.

A third sheet of metal foil was preheated in an oven to the temperature described in the "preheating temperature" column of the tables. Immediately after that, a second stack was formed by stacking the conductor wiring of the printed wiring board at 25° C., a single second prepreg at 25° C., and the third sheet of metal foil one on top of another such that the second prepreg was interposed between the conductor wiring and the third sheet of metal foil. Note that "-" in the "preheating temperature" column indicates that a second stack was formed by stacking the conductor wiring of the printed wiring board at 25° C., a single second prepreg at 25° C., and the third sheet of metal foil at 25° C. one on top of another such that the second prepreg was interposed between the conductor wiring and the third sheet of metal foil without preheating the third sheet of metal foil. When formed, the second stack was immediately thermally pressed to form a second insulating layer by thermally curing the second prepreg. Then, the second stack was cooled to an ordinary temperature. In this manner, a multilayer printed wiring board was made.

2. Evaluation

A sample having dimensions of 20 cm square in a plan view was cut out of the multilayer printed wiring board. The sheets of copper foil on both sides of the sample were completely etched away and then the sample was heated at 200° C. for one hour.

Next, the sample was put on a flat stage to measure the maximum lift of the sample over the stage. The value thus measured was regarded as the degree of warp. The degree of warp was defined by a positive value when the sample had warped to protrude in the first direction. On the other hand, the degree of warp was defined by a negative value when the sample had warped to protrude in the opposite direction from the first direction. The results are shown in the following Tables 1-4:

As can be seen from the results shown in these Tables 1-4, the warp of the multilayer printed wiring board was reduced in specific examples compared to comparative examples.

TABLE 1

| | | | | Comparative Example | | |
|---|---|---|---|---|---|---|
| | | | | 1 | 2 | 3 |
| 1st prepreg (% by mass) | Composition | Thermosetting resin | Polyfunctional epoxy resin | 18.6 | 20.2 | 28.3 |
| | | Curing agent | Phenol based curing agent | 16.3 | 17.5 | 24.7 |
| | | Curing promoter | 2-ethyl-4-methyl imidazole | 0.04 | 0.04 | 0.04 |
| | | Inorganic filler | Silica | 23.8 | 20.3 | — |
| | | | Talc | 2.5 | 2.6 | 3.7 |
| | | | Aluminum hydroxide | 8.8 | 9.4 | 13.3 |
| | Fibrous base material | | | 30 | 30 | 30 |
| 2nd prepreg (% by mass) | Composition | Thermosetting resin | Polyfunctional epoxy resin | 18.6 | 20.2 | 28.3 |
| | | Curing agent | Phenol based curing agent | 16.3 | 17.5 | 24.7 |
| | | Curing promoter | 2-ethyl-4-methyl imidazole | 0.04 | 0.04 | 0.04 |
| | | Inorganic filler | Silica | 23.8 | 20.3 | — |
| | | | Talc | 2.5 | 2.6 | 3.7 |
| | | | Aluminum hydroxide | 8.8 | 9.4 | 13.3 |
| | Fibrous base material | | | 30 | 30 | 30 |
| 1st sheet of metal foil | | | Thickness (μm) | 9 | 9 | 9 |
| | | | Linear expansion coefficient | 16 | 16 | 16 |
| 2nd sheet of metal foil | | | Thickness (μm) | 2 | 2 | 2 |
| | | | Linear expansion coefficient | 16 | 16 | 16 |
| 3rd sheet of metal foil | | | Thickness (μm) | 2 | 2 | 2 |
| | | | Linear expansion coefficient | 16 | 16 | 16 |
| 1st insulating layer | | | Thickness (μm) | 25 | 25 | 25 |
| | | | Linear expansion coefficient | 15 | 20 | 60 |
| 2nd insulating layer | | | Thickness (μm) | 25 | 25 | 25 |
| | | | Linear expansion coefficient | 15 | 20 | 60 |
| Thermal pressing condition (1st cycle) | | | Highest heating temperature (° C.) | 270 | 270 | 270 |
| | | | Pressure applied (MPa) | 40 | 40 | 40 |
| | | | Heating duration (min) | 3 | 3 | 3 |
| Preheating temperature (° C.) | | | | — | — | 120 |
| Thermal pressing condition (2nd cycle) | | | Highest heating temperature (° C.) | 300 | 300 | 300 |
| | | | Pressure applied (MPa) | 45 | 45 | 45 |
| | | | Heating duration (min) | 3 | 3 | 3 |
| | | | Tension (N) of 2nd insulating layer | 15 | 15 | 15 |
| Evaluation | | | Degree of warp (mm) | +15 | +12 | −35 |

TABLE 2

|  |  |  |  | Examples | | | | | | |
|---|---|---|---|---|---|---|---|---|---|---|
|  |  |  |  | 1 | 2 | 3 | 4 | 5 | 6 | 7 |
| 1st prepreg (% by mass) | Composition | Thermosetting resin | Polyfunctional epoxy resin | 18.6 | 18.6 | 18.6 | 18.6 | 18.6 | 18.6 | 13.3 |
|  |  | Curing agent | Phenol based curing agent | 16.3 | 16.3 | 16.3 | 16.3 | 16.3 | 16.3 | 11.5 |
|  |  | Curing promoter | 2-ethyl-4-methyl imidazole | 0.04 | 0.04 | 0.04 | 0.04 | 0.04 | 0.04 | 0.02 |
|  |  | Inorganic filler | Silica | 23.8 | 23.8 | 23.8 | 23.8 | 23.8 | 23.8 | 37.3 |
|  |  |  | Talc | 2.5 | 2.5 | 2.5 | 2.5 | 2.5 | 2.5 | 1.7 |
|  |  |  | Aluminum hydroxide | 8.8 | 8.8 | 8.8 | 8.8 | 8.8 | 8.8 | 6.2 |
|  | Fibrous base material |  |  | 30 | 30 | 30 | 30 | 30 | 30 | 30 |
| 2nd prepreg (% by mass) | Composition | Thermosetting resin | Polyfunctional epoxy resin | 18.6 | 18.6 | 18.6 | 18.6 | 18.6 | 18.6 | 13.3 |
|  |  | Curing agent | Phenol based curing agent | 16.3 | 16.3 | 16.3 | 16.3 | 16.3 | 16.3 | 11.5 |
|  |  | Curing promoter | 2-ethyl-4-methyl imidazole | 0.04 | 0.04 | 0.04 | 0.04 | 0.04 | 0.04 | 0.02 |
|  |  | Inorganic filler | Silica | 23.8 | 23.8 | 23.8 | 23.8 | 23.8 | 23.8 | 37.3 |
|  |  |  | Talc | 2.5 | 2.5 | 2.5 | 2.5 | 2.5 | 2.5 | 1.7 |
|  |  |  | Aluminum hydroxide | 8.8 | 8.8 | 8.8 | 8.8 | 8.8 | 8.8 | 6.2 |
|  | Fibrous base material |  |  | 30 | 30 | 30 | 30 | 30 | 30 | 30 |
| 1st sheet of metal foil |  | Thickness (μm) |  | 9 | 9 | 9 | 9 | 9 | 9 | 9 |
|  |  | Linear expansion coefficient |  | 16 | 16 | 16 | 16 | 16 | 16 | 16 |
| 2nd sheet of metal foil |  | Thickness (μm) |  | 2 | 2 | 2 | 2 | 2 | 2 | 2 |
|  |  | Linear expansion coefficient |  | 16 | 16 | 16 | 16 | 16 | 16 | 16 |
| 3rd sheet of metal foil |  | Thickness (μm) |  | 2 | 2 | 2 | 2 | 2 | 2 | 2 |
|  |  | Linear expansion coefficient |  | 16 | 16 | 16 | 16 | 16 | 16 | 16 |
| 1st insulating layer |  | Thickness (μm) |  | 25 | 25 | 25 | 25 | 25 | 25 | 25 |
|  |  | Linear expansion coefficient |  | 15 | 15 | 15 | 15 | 15 | 15 | 5 |
| 2nd insulating layer |  | Thickness (μm) |  | 25 | 25 | 25 | 25 | 25 | 25 | 25 |
|  |  | Linear expansion coefficient |  | 15 | 15 | 15 | 15 | 15 | 15 | 5 |
| Thermal pressing condition (1st cycle) |  | Highest heating temperature (° C.) |  | 270 | 270 | 270 | 270 | 270 | 270 | 270 |
|  |  | Pressure applied (MPa) |  | 40 | 40 | 40 | 40 | 40 | 40 | 40 |
|  |  | Heating duration (min) |  | 3 | 3 | 3 | 3 | 3 | 3 | 3 |
| Preheating temperature (° C.) |  |  |  | 60 | 70 | 120 | 170 | 230 | 250 | 120 |
| Thermal pressing condition (2nd cycle) |  | Highest heating temperature (° C.) |  | 300 | 300 | 300 | 300 | 300 | 300 | 300 |
|  |  | Pressure applied (MPa) |  | 45 | 45 | 45 | 45 | 45 | 45 | 45 |
|  |  | Heating duration (min) |  | 3 | 3 | 3 | 3 | 3 | 3 | 3 |
|  |  | Tension (N) of 2nd insulating layer |  | 15 | 15 | 15 | 15 | 15 | 15 | 15 |
| Evaluation |  | Degree of warp (mm) |  | +2 | 0 | −12 | −16 | −23 | −33 | 0 |

TABLE 3

|  |  |  |  | Cmp. Ex. | Example | | | Cmp. Ex. | Example | | |
|---|---|---|---|---|---|---|---|---|---|---|---|
|  |  |  |  | 4 | 8 | 9 | 10 | 5 | 11 | 12 | 13 |
| 1st prepreg (% by mass) | Composition | Thermosetting resin | Polyfunctional epoxy resin | 18.6 | 18.6 | 18.6 | 18.6 | 18.6 | 18.6 | 18.6 | 18.6 |
|  |  | Curing agent | Phenol based curing agent | 16.3 | 16.3 | 16.3 | 16.3 | 16.3 | 16.3 | 16.3 | 16.3 |
|  |  | Curing promoter | 2-ethyl-4-methyl imidazole | 0.04 | 0.04 | 0.04 | 0.04 | 0.04 | 0.04 | 0.04 | 0.04 |
|  |  | Inorganic filler | Silica | 23.8 | 23.8 | 23.8 | 23.8 | 23.8 | 23.8 | 23.8 | 23.8 |
|  |  |  | Talc | 2.5 | 2.5 | 2.5 | 2.5 | 2.5 | 2.5 | 2.5 | 2.5 |
|  |  |  | Aluminum hydroxide | 8.8 | 8.8 | 8.8 | 8.8 | 8.8 | 8.8 | 8.8 | 8.8 |
|  | Fibrous base material |  |  | 30 | 30 | 30 | 30 | 30 | 30 | 30 | 30 |

TABLE 3-continued

|  |  |  |  | Cmp. Ex. 4 | Example 8 | Example 9 | Example 10 | Cmp. Ex. 5 | Example 11 | Example 12 | Example 13 |
|---|---|---|---|---|---|---|---|---|---|---|---|
| 2nd prepreg (% by mass) | Composition | Thermosetting resin | Polyfunctional epoxy resin | 18.6 | 18.6 | 18.6 | 18.6 | 18.6 | 18.6 | 18.6 | 18.6 |
|  |  | Curing agent | Phenol based curing agent | 16.3 | 16.3 | 16.3 | 16.3 | 16.3 | 16.3 | 16.3 | 16.3 |
|  |  | Curing promoter | 2-ethyl-4-methyl imidazole | 0.04 | 0.04 | 0.04 | 0.04 | 0.04 | 0.04 | 0.04 | 0.04 |
|  |  | Inorganic filler | Silica | 23.8 | 23.8 | 23.8 | 23.8 | 23.8 | 23.8 | 23.8 | 23.8 |
|  |  |  | Talc | 2.5 | 2.5 | 2.5 | 2.5 | 2.5 | 2.5 | 2.5 | 2.5 |
|  |  |  | Aluminum hydroxide | 8.8 | 8.8 | 8.8 | 8.8 | 8.8 | 8.8 | 8.8 | 8.8 |
|  | Fibrous base material |  |  | 30 | 30 | 30 | 30 | 30 | 30 | 30 | 30 |
| 1st sheet of metal foil |  |  | Thickness (μm) | 9 | 9 | 9 | 9 | 9 | 9 | 9 | 9 |
|  |  |  | Linear expansion coefficient | 16 | 16 | 16 | 16 | 16 | 16 | 16 | 16 |
| 2nd sheet of metal foil |  |  | Thickness (μm) | 2 | 2 | 2 | 2 | 2 | 2 | 2 | 2 |
|  |  |  | Linear expansion coefficient | 16 | 16 | 16 | 16 | 16 | 16 | 16 | 16 |
| 3rd sheet of metal foil |  |  | Thickness (μm) | 6 | 6 | 6 | 6 | 12 | 12 | 12 | 12 |
|  |  |  | Linear expansion coefficient | 16 | 16 | 16 | 16 | 16 | 16 | 16 | 16 |
| 1st insulating layer |  |  | Thickness (μm) | 25 | 25 | 25 | 25 | 25 | 25 | 25 | 25 |
|  |  |  | Linear expansion coefficient | 15 | 15 | 15 | 15 | 15 | 15 | 15 | 15 |
| 2nd insulating layer |  |  | Thickness (μm) | 25 | 25 | 25 | 25 | 25 | 25 | 25 | 25 |
|  |  |  | Linear expansion coefficient | 15 | 15 | 15 | 15 | 15 | 15 | 15 | 15 |
| Thermal pressing condition (1st cycle) |  |  | Highest heating temperature (° C.) | 270 | 270 | 270 | 270 | 270 | 270 | 270 | 270 |
|  |  |  | Pressure applied (MPa) | 40 | 40 | 40 | 40 | 40 | 40 | 40 | 40 |
|  |  |  | Heating duration (min) | 3 | 3 | 3 | 3 | 3 | 3 | 3 | 3 |
| Preheating temperature (° C.) |  |  |  | — | 120 | 170 | 220 | — | 120 | 170 | 220 |
| Thermal pressing condition (2nd cycle) |  |  | Highest heating temperature (° C.) | 300 | 300 | 300 | 300 | 300 | 300 | 300 | 300 |
|  |  |  | Pressure applied (MPa) | 45 | 45 | 45 | 45 | 45 | 45 | 45 | 45 |
|  |  |  | Heating duration (min) | 3 | 3 | 3 | 3 | 3 | 3 | 3 | 3 |
|  |  |  | Tension (N) of 2nd insulating layer | 15 | 15 | 15 | 15 | 15 | 15 | 15 | 15 |
| Evaluation |  |  | Degree of warp (mm) | +18 | −15 | −19 | −21 | +18 | −10 | −16 | −23 |

TABLE 4

|  |  |  |  | Cmp. Ex. 6 | Example 14 | Example 15 | Example 16 | Cmp. Ex. 7 | Example 17 | Example 18 | Example 19 |
|---|---|---|---|---|---|---|---|---|---|---|---|
| 1st prepreg (% by mass) | Composition | Thermosetting resin | Polyfunctional epoxy resin | 18.6 | 18.6 | 18.6 | 18.6 | 18.6 | 18.6 | 18.6 | 18.6 |
|  |  | Curing agent | Phenol based curing agent | 16.3 | 16.3 | 16.3 | 16.3 | 16.3 | 16.3 | 16.3 | 16.3 |
|  |  | Curing promoter | 2-ethyl-4-methyl imidazole | 0.04 | 0.04 | 0.04 | 0.04 | 0.04 | 0.04 | 0.04 | 0.04 |
|  |  | Inorganic filler | Silica | 23.8 | 23.8 | 23.8 | 23.8 | 23.8 | 23.8 | 23.8 | 23.8 |
|  |  |  | Talc | 2.5 | 2.5 | 2.5 | 2.5 | 2.5 | 2.5 | 2.5 | 2.5 |
|  |  |  | Aluminum hydroxide | 8.8 | 8.8 | 8.8 | 8.8 | 8.8 | 8.8 | 8.8 | 8.8 |
|  | Fibrous base material |  |  | 30 | 30 | 30 | 30 | 30 | 30 | 30 | 30 |
| 2nd prepreg (% by mass) | Composition | Thermosetting resin | Polyfunctional epoxy resin | 18.6 | 18.6 | 18.6 | 18.6 | 18.6 | 18.6 | 18.6 | 18.6 |
|  |  | Curing agent | Phenol based curing agent | 16.3 | 16.3 | 16.3 | 16.3 | 16.3 | 16.3 | 16.3 | 16.3 |
|  |  | Curing promoter | 2-ethyl-4-methyl imidazole | 0.04 | 0.04 | 0.04 | 0.04 | 0.04 | 0.04 | 0.04 | 0.04 |
|  |  | Inorganic filler | Silica | 23.8 | 23.8 | 23.8 | 23.8 | 23.8 | 23.8 | 23.8 | 23.8 |
|  |  |  | Talc | 2.5 | 2.5 | 2.5 | 2.5 | 2.5 | 2.5 | 2.5 | 2.5 |
|  |  |  | Aluminum hydroxide | 8.8 | 8.8 | 8.8 | 8.8 | 8.8 | 8.8 | 8.8 | 8.8 |
|  | Fibrous base material |  |  | 30 | 30 | 30 | 30 | 30 | 30 | 30 | 30 |

TABLE 4-continued

|  |  | Cmp. Ex. 6 | Example 14 | Example 15 | Example 16 | Cmp. Ex. 7 | Example 17 | Example 18 | Example 19 |
|---|---|---|---|---|---|---|---|---|---|
| 1st sheet of metal foil | Thickness (μm) | 9 | 9 | 9 | 9 | 9 | 9 | 9 | 9 |
|  | Linear expansion coefficient | 16 | 16 | 16 | 16 | 16 | 16 | 16 | 16 |
| 2nd sheet of metal foil | Thickness (μm) | 2 | 2 | 2 | 2 | 2 | 2 | 2 | 2 |
|  | Linear expansion coefficient | 16 | 16 | 16 | 16 | 16 | 16 | 16 | 16 |
| 3rd sheet of metal foil | Thickness (μm) | 18 | 18 | 18 | 18 | 35 | 35 | 35 | 35 |
|  | Linear expansion Coefficient | 16 | 16 | 16 | 16 | 16 | 16 | 16 | 16 |
| 1st insulating layer | Thickness (μm) | 25 | 25 | 25 | 25 | 25 | 25 | 25 | 25 |
|  | Linear expansion Coefficient | 15 | 15 | 15 | 15 | 15 | 15 | 15 | 15 |
| 2nd insulating layer | Thickness (μm) | 25 | 25 | 25 | 25 | 25 | 25 | 25 | 25 |
|  | Linear expansion Coefficient | 15 | 15 | 15 | 15 | 15 | 15 | 15 | 15 |
| Thermal pressing condition (1st cycle) | Highest heating temperature (° C.) | 270 | 270 | 270 | 270 | 270 | 270 | 270 | 270 |
|  | Pressure applied (MPa) | 40 | 40 | 40 | 40 | 40 | 40 | 40 | 40 |
|  | Heating duration (min) | 3 | 3 | 3 | 3 | 3 | 3 | 3 | 3 |
| Preheating temperature (° C.) |  | — | 120 | 170 | 220 | — | 120 | 170 | 220 |
| Thermal pressing condition (2nd cycle) | Highest heating temperature (° C.) | 300 | 300 | 300 | 300 | 300 | 300 | 300 | 300 |
|  | Pressure applied (MPa) | 45 | 45 | 45 | 45 | 45 | 45 | 45 | 45 |
|  | Heating duration (min) | 3 | 3 | 3 | 3 | 3 | 3 | 3 | 3 |
|  | Tension (N) of 2nd insulating layer | 15 | 15 | 15 | 15 | 15 | 15 | 15 | 15 |
| Evaluation | Degree of warp (mm) | +14 | −10 | −18 | −22 | +17 | −7 | −17 | −20 |

REFERENCE SIGNS LIST

1 Printed Wiring Board
10 Multilayer Printed Wiring Board
2 Metal Layer
21 First Sheet of Metal Foil
22 Second Sheet of Metal Foil
23 Third Sheet of Metal Foil
31 First Prepreg
32 Second Prepreg
41 First Insulating Layer
42 Second Insulating Layer
51 Conductor Wiring
61 First Stack
62 Second Stack
7 Double-Sided Metal-Clad Laminate

The invention claimed is:

1. A method for manufacturing a multilayer printed wiring board, the method comprising:
   forming a first stack by stacking a first sheet of metal foil, a first prepreg, and a second sheet of metal foil, one on top of another such that the first prepreg is interposed between the first sheet of metal foil and the second sheet of metal foil;
   forming a first insulating layer from the first prepreg by thermally pressing the first stack and thereby thermally curing the first prepreg to make a double-sided metal-clad laminate in which the second sheet of metal foil, the first insulating layer and the first sheet of metal foil are stacked one on top of another in this order;
   forming conductor wiring by partially removing the first sheet of metal foil from the double-sided metal-clad laminate to make a printed wiring board in which the second sheet of metal foil, the first insulating layer, and the conductor wiring are stacked one on top of another in this order;
   forming a second stack by stacking the conductor wiring of the printed wiring board, a second prepreg, and a third sheet of metal foil, one on top of another such that the second prepreg is interposed between the conductor wiring of the printed wiring board and the third sheet of metal foil; and
   forming a second insulating layer from the second prepreg by thermally pressing the second stack without preheating and thereby thermally curing the second prepreg,
   in forming the second stack, the third sheet of metal foil after having been preheated being stacked on the second prepreg without preheating the printed wiring board and the second prepreg,
   the first insulating layer having a lower linear expansion coefficient than any of the first sheet of metal foil or the second sheet of metal foil does.

2. The method of claim 1,
   wherein the first insulating layer has a thickness of 50 μm or less.

3. The method of claim 1,
   wherein the first insulating layer has a linear expansion coefficient falling within a range from 5 ppm/K to 17 ppm/K.

4. The method of claim 1,
   wherein the third sheet of metal foil has a thickness falling within a range from 0.002 mm to 0.035 mm.

5. The method of claim 1,
   wherein the second insulating layer has a lower linear expansion coefficient than the third sheet of metal foil does.

6. The method of claim 1,
wherein the second insulating layer has a linear expansion coefficient falling within a range from 5 ppm/K to 17 ppm/K.

7. The method of claim 1,
wherein the first prepreg includes a thermosetting resin composition and a fibrous base material,
the thermosetting resin composition contains an inorganic filler, and
a subtotal of the inorganic filler, contained in the thermosetting resin composition, and the fibrous base material accounts for 50% by mass to 85% by mass of a grand total of the thermosetting resin composition and the fibrous base material.

8. The method of claim 1,
wherein the multilayer printed wiring board has a degree of warp greater than −35 mm and equal to or less than 2 mm.

9. The method of claim 1, comprising:
preheating the third sheet of metal foil to a temperature falling within a range from 60° C. to 250° C.

10. The method of claim 1,
wherein in the first stack, the second sheet of metal foil, the first prepreg, and the first sheet of metal foil are arranged in this order in a first direction,
the printed wiring board is made so that the printed wiring board warps to protrude in the first direction, and
the multilayer printed wiring board is manufactured so that the multilayer printed wiring board becomes flatter than the printed wiring board or warp to protrude in the opposite direction from the first direction.

\* \* \* \* \*